(12) United States Patent
Paek et al.

(10) Patent No.: US 10,686,156 B2
(45) Date of Patent: Jun. 16, 2020

(54) ORGANIC LIGHT EMITTING DISPLAY DEVICE WITH AUXILIARY ELECTRODE AND CONDUCTIVE MEMBER AND METHOD OF FABRICATING THE SAME

(71) Applicant: LG Display Co., Ltd., Seoul (KR)

(72) Inventors: Seung-Han Paek, Bucheon-si (KR); Hyo-Dae Bae, Daegu (KR); Young-Mu Oh, Seoul (KR); Jeong-Won Lee, Goyang-si (KR); Heon-Il Song, Paju-si (KR); Jong-Hoon Yeo, Incheon (KR)

(73) Assignee: LG Display Co., Ltd., Seoul (KR)

( * ) Notice: Subject to any disclaimer, the term of this patent is extended or adjusted under 35 U.S.C. 154(b) by 289 days.

(21) Appl. No.: 15/334,997

(22) Filed: Oct. 26, 2016

(65) Prior Publication Data

US 2017/0125725 A1    May 4, 2017

(30) Foreign Application Priority Data

Nov. 3, 2015  (KR) .......................... 10-2015-0154133

(51) Int. Cl.
   *H01L 51/52*  (2006.01)
   *H01L 27/32*  (2006.01)
   (Continued)

(52) U.S. Cl.
   CPC ...... *H01L 51/5212* (2013.01); *H01L 27/3246* (2013.01); *H01L 27/3279* (2013.01);
   (Continued)

(58) Field of Classification Search
   CPC .................................................. H01L 51/5228
   See application file for complete search history.

(56) References Cited

U.S. PATENT DOCUMENTS

2005/0253508 A1    11/2005  Okano
2009/0286445 A1*   11/2009  Yamazaki ........... H01L 51/5228
                                                    445/24

(Continued)

FOREIGN PATENT DOCUMENTS

KR    10-2015-0002422 A    1/2015

OTHER PUBLICATIONS

European Patent Office, Search Report and Opinion, European Patent Application No. 16184355.2, dated Mar. 17, 2017, nine pages.

(Continued)

*Primary Examiner* — Lex H Malsawma
*Assistant Examiner* — Geoffrey H Ida
(74) *Attorney, Agent, or Firm* — Fenwick & West LLP

(57) ABSTRACT

An organic light emitting display device includes a substrate including a pixel region, and a first electrode over the substrate and in the pixel region. An auxiliary electrode is disposed over the substrate, and is spaced apart from the first electrode and disposed in between the pixel region and another pixel region. A second electrode is placed over the first electrode and the auxiliary electrode, and an organic layer is disposed between each of the first electrode and the second electrode, and the second electrode and the auxiliary electrode. A conductive member is placed between the auxiliary electrode and the second electrode and electrically connects the second electrode to the auxiliary electrode.

18 Claims, 8 Drawing Sheets

(51) Int. Cl.
*H01L 51/00* (2006.01)
*H01L 51/50* (2006.01)
*H01L 51/56* (2006.01)

(52) U.S. Cl.
CPC ...... *H01L 51/0003* (2013.01); *H01L 51/0021* (2013.01); *H01L 51/0022* (2013.01); *H01L 51/504* (2013.01); *H01L 51/5228* (2013.01); *H01L 51/56* (2013.01); *H01L 2227/323* (2013.01)

(56) References Cited

U.S. PATENT DOCUMENTS

| | | | |
|---|---|---|---|
| 2010/0134735 A1* | 6/2010 | Nakamura | H01L 31/1055 349/116 |
| 2012/0248472 A1* | 10/2012 | Schwab | H01L 27/3204 257/88 |
| 2013/0134449 A1 | 5/2013 | Chen et al. | |
| 2014/0183479 A1 | 7/2014 | Park et al. | |
| 2014/0346459 A1* | 11/2014 | Song | H01L 51/5228 257/40 |
| 2015/0090989 A1 | 4/2015 | Matsumoto et al. | |
| 2015/0102294 A1 | 4/2015 | Choi et al. | |

OTHER PUBLICATIONS

China National Intellectual Property Administration, Search Report, CN Patent Application No. 2016109477392, Mar. 3, 2020, one page.

* cited by examiner

ORGANIC LIGHT EMITTING DISPLAY DEVICE WITH AUXILIARY ELECTRODE AND CONDUCTIVE MEMBER AND METHOD OF FABRICATING THE SAME

CROSS-REFERENCE TO RELATED APPLICATIONS

The present application claims the benefit of Republic of Korea Patent Application No. 10-2015-0154133, filed in the Republic of Korea on Nov. 3, 2015, which is hereby incorporated by reference in its entirety.

BACKGROUND

1. Field

The present disclosure relates to an organic light emitting display (OLED) device, and more particularly, to an OLED being capable of preventing a brightness non-uniformity problem.

2. Discussion of Related Art

Recently, flat panel display devices, such as a plasma display panel (PDP), a liquid crystal display (LCD) device, and an OLED device, are widely researched and used.

Among these flat panel display devices, since the OLED device as a self-emission type display device does not require a backlight unit, the OLED device may have advantages of light weight and thin profile.

In addition, the OLED device has excellent characteristics of a viewing angle, a contrast ratio, power consumption, a response time, production costs, production yield, and so on.

The OLED device may include a switching thin film transistor (TFT), which is connected to gate and data lines, a driving TFT, which is connected to the switching TFT, and an organic emitting diode. The organic emitting diode is connected to the driving TFT and includes a first electrode, an organic emitting layer and a second electrode.

The first electrode may serve as an anode and may include a transparent conductive material having a relatively high work function. The second electrode may serve as a cathode and may include a metallic material having a relatively low work function. The metallic material may have an opaque property.

In a top emission type OLED device, the light from the organic emitting layer passes through the second electrode that is partially opaque. Accordingly, a thickness of the second electrode should be controlled such that the second electrode has a good light-transmissive property.

However, when the thickness of the second electrode is lowered, the resistance of the second electrode is increased such that a voltage drop problem in the second electrode is generated. Namely, a brightness non-uniformity problem in the OLED device is generated.

Particularly, the above brightness non-uniformity problem is serious in a large-size OLED device.

To prevent the above brightness non-uniformity problem, an auxiliary line, which is connected to the second electrode, may be formed to reduce the resistance of the second electrode.

FIG. 1 is a schematic plane view of the related art OLED device, and FIG. 2 is a schematic cross-sectional view taken along the line II-II in FIG. 1.

Referring to FIG. 1, the related art OLED device includes a substrate 11, which includes a plurality of pixel regions P, a first electrode 50 disposed on or over the substrate 11 and in each pixel region P, an auxiliary electrode 53 disposed at a boundary of the pixel region P and a bank 57 disposed at the boundary of the pixel region P. The auxiliary electrode 53 is spaced apart from the first electrode 50. The bank 57 covers the auxiliary electrode 53 and edges of the first electrode 50 and includes an auxiliary contact hole 55 exposing a portion of the auxiliary electrode 53.

The auxiliary electrode 53 and the auxiliary contact hole 55 have substantially the same width as the first electrode 50 and are separately arranged at each pixel region P.

Referring to FIG. 2, a semiconductor layer 13 including a first region 13a and second regions 13b at both sides of the first region 13a is formed on the substrate 11. The first region 13a is formed of intrinsic poly-silicon, and the second region 13b is formed of impurity-doped poly-silicon.

A gate insulating layer 15 is formed on the semiconductor layer 13, and a gate electrode 25 corresponding to the first region 13a of the semiconductor layer 13 is formed on the gate insulating layer 15. An interlayer insulating layer 17 is formed on the gate electrode 25.

In this instance, semiconductor contact holes 21 are formed through the gate insulating layer 15 and the interlayer insulating layer 17 to expose the second regions 13b of the semiconductor layer 13.

A source electrode 33 and a drain electrode 36, which are spaced apart from each other, are formed on the interlayer insulating layer 17. The source and drain electrodes 33 and 36 are electrically connected to the second regions 13b of the semiconductor layer 13 through the semiconductor contact holes 21, respectively.

The semiconductor layer 13, the gate electrode 25, the source electrode 33 and the drain electrode 36 constitute a driving TFT DTr.

A passivation layer 19, which may provide a flat top surface, is formed on or over the driving TFT DTr and over an entire surface of the substrate 11. A drain contact hole 43 exposing the drain electrode 36 of the driving TFT DTr is formed through the passivation layer 19.

The first electrode 50, which is connected to the drain electrode 36 through the drain contact hole 43, is formed on the passivation layer 19 and in the pixel region P, and the auxiliary electrode 53, which is spaced apart from the first electrode 50, is formed on the passivation layer 19 and at the boundary of the pixel region P.

The bank 57, which includes the auxiliary contact hole 55 exposing the auxiliary electrode 53 and covers edges of the first electrode 50 and the auxiliary electrode 53, is formed a the boundary of the pixel region P.

The bank 57 has a lattice shape to surround the pixel region P, and an organic emitting layer 60 is formed on the first electrode 50 in the pixel region P. In addition, a second electrode 70 is formed over an entire surface of the substrate 11 including the bank 57 and the organic emitting layer 60. As a result, the second electrode 70 is electrically connected to auxiliary electrode 53 through the auxiliary contact hole 55.

The first and second electrodes 50 and 70 and the organic emitting layer 60 therebetween constitute an organic emitting diode E.

Since the auxiliary electrode 53 is electrically connected to the second electrode 70, the sheet resistance of the second electrode 70 is lowered. As a result, the brightness non-uniformity problem can be prevented or minimized.

On the other hand, the organic emitting layer 60 may include a hole injection layer (HIL), a hole transport layer (HTL), an emitting material layer (EML), an electron transport layer (ETL) and an electron injection layer (EIL) sequentially stacked on the first electrode 50.

Each of the layers of the organic emitting layer 60 may be formed by a solution process or a deposition process. For example, since some materials for each layer of the organic emitting layer 60 has bad stability for the soluble process, the HIL, the HTL and the EML are formed by the soluble process and the ETL and the EIL are formed by the deposition process.

In addition, the blue emitting material does not provide the desired property by the soluble process. Accordingly, the blue emitting material pattern may be formed by the deposition process over an entire surface of the substrate 11. Namely, each of the HIL, the HTL, the red emitting material pattern and the green emitting material pattern is formed in each pixel region P by the solution process, while each of the blue emitting material pattern, the ETL and the EIL is formed over an entire surface of the substrate 11 through a deposition process.

SUMMARY

Accordingly, embodiments are directed to an OLED device and a method of fabricating the same that substantially obviate one or more of the above problems due to limitations and disadvantages of the related art.

There is provided an OLED device including a second electrode having reduced sheet resistance.

An object of the claimed subject-matter is to simplify a fabricating process and reduce production cost of an OLED device.

Additional features and advantages will be set forth in the description which follows, and in part will be apparent from the description, or may be learned by practice. The objectives and other advantages will be realized and attained by the structure particularly pointed out in the written description and claims hereof as well as the appended drawings. Aspects of an invention are defined in the appended independent claims.

There is provided an organic light emitting display device including a substrate including a pixel region, a first electrode over the substrate and in the pixel region, an auxiliary electrode over the substrate and at a boundary of the pixel region, a second electrode over the first electrode and the auxiliary electrode, a conductive member between the auxiliary electrode and the second electrode and electrically connecting the second electrode to the auxiliary electrode, and an organic layer between each of the first electrode and the auxiliary electrode and the second electrode, wherein the organic layer is opened by the conductive member.

The organic layer may include a blue emitting layer.

The organic layer may further include at least one of the red emitting layer and a green emitting layer between the first and second electrodes.

The auxiliary electrode may extend along a boundary portion of the pixel region.

The organic light emitting display device may further include a bank disposed on edges of the first electrode and include an auxiliary contact hole exposing the auxiliary electrode.

The conductive member may be disposed in the auxiliary contact hole and may contact the auxiliary electrode in a portion where the organic layer is opened.

The conductive member may contact the auxiliary electrode and a side surface of the bank in the auxiliary contact hole.

There is further provided an organic light emitting display device including a substrate including a pixel region. a first electrode over the substrate and in the pixel region, an auxiliary electrode over the substrate and at a boundary of the pixel region, a bank on edges of the first electrode and including an auxiliary contact hole exposing the auxiliary electrode, an organic material pattern on the bank, an organic emitting layer on the first electrode, a conductive member in the auxiliary contact hole, and a second electrode on the conductive member and the organic layer, wherein the second electrode is electrically connected to the auxiliary electrode via the conductive member.

The organic material pattern may contact edges of the auxiliary electrode, and the conductive member may contact the center of the auxiliary electrode.

The conductive member may contact a side surface of the bank in the auxiliary contact hole and an upper surface of the auxiliary electrode.

The organic material pattern may have a thinner part on the auxiliary electrode, and the conductive member may be disposed on the thinner part of the organic material pattern.

There is also provided a method of fabricating an organic emitting display device. A first electrode and an auxiliary electrode is formed over a substrate including a pixel region, wherein the first electrode is disposed in the pixel region. The auxiliary electrode is disposed at a boundary of the pixel region, and a bank on edges of the first electrode and including an auxiliary contact hole exposing the auxiliary electrode is formed. an organic material pattern is formed on the bank and an organic emitting layer is formed on the first electrode. A conductive member is formed in the auxiliary contact hole and is electrically connected to the auxiliary electrode. A second electrode is formed on the conductive member and the organic layer.

The conductive member may be formed by dropping a metal paste into the auxiliary contact hole such that the organic material pattern in the auxiliary contact hole is dissolved, and drying the metal paste and the dissolved organic material pattern such that the conductive member directly or indirectly contacting the auxiliary electrode is formed.

The metal paste may include a conductive particle and a binder including a resin, a solvent and additives.

The organic material pattern and the organic emitting layer may be formed by forming a lower layer of the organic emitting layer by a solution process, and forming the organic material pattern and an upper layer of the organic emitting layer by a deposition process.

Embodiments also relate to an organic light emitting display device. The organic light emitting display device includes a substrate including a plurality of pixel regions, and a first electrode over the substrate and in a pixel region of the plurality of pixel regions. An auxiliary electrode is over the substrate, and the auxiliary electrode is spaced apart from the first electrode and disposed in between the pixel region and another pixel region of the plurality of pixel regions. A second electrode is over the first electrode and the auxiliary electrode, and an organic layer is disposed between the first electrode and the second electrode, and is disposed between the second electrode and the auxiliary electrode. A conductive droplet is placed between the auxiliary electrode and the second electrode. The conductive droplet electrically connects the second electrode to the auxiliary electrode.

Embodiments also relate to a method of fabricating an organic emitting display device. A first electrode is formed on a substrate having a plurality of pixel regions. The first electrode is formed in a pixel region of the plurality of pixel regions. An auxiliary electrode is formed over the substrate, and the auxiliary electrode is spaced apart from the first electrode and disposed in between the pixel region and another pixel region of the plurality of pixel regions. An organic layer is formed over at least the first electrode and the auxiliary electrode. A conductive member is formed on the auxiliary electrode, and a second electrode is formed over the organic layer and the conductive member. The second electrode is electrically connected to the auxiliary electrode through the conductive member.

Embodiments also relate to an organic light emitting display device. The organic light emitting device includes a substrate having a plurality of first electrodes, and an auxiliary electrode disposed in between a first one of the first electrodes and a second one of the first electrodes. The auxiliary electrode is spaced apart from the first one of the first electrodes. An organic emitting layer disposed on the first one of the first electrodes, and a conductive member is disposed on the auxiliary electrode. A second electrode is disposed on the organic emitting layer and the conductive member, and the second electrode is electrically connected to the auxiliary electrode through the conductive member.

It is to be understood that both the foregoing general description and the following detailed description are by example and explanatory and are intended to provide further explanation of the claimed subject-matter.

BRIEF DESCRIPTION OF THE DRAWINGS

The accompanying drawings, which are included to provide a further understanding of the disclosure and are incorporated in and constitute a part of this specification, illustrate embodiments and together with the description serve to explain the principles of the disclosure.

DETAILED DESCRIPTION OF EMBODIMENTS

Reference will now be made in detail to embodiments, examples of which are illustrated in the accompanying drawings.

In the related art OLED device, the blue emitting material pattern, the ETL and the EIL, which are formed by the deposition process, are formed on or over the auxiliary electrode 53 as well as the first electrode 50. Accordingly, to electrically connect the second electrode 70 to the auxiliary electrode 53 through the auxiliary contact hole 55, the above layers on or over the auxiliary electrode 53 in the auxiliary contact hole 55 should be removed during the manufacturing process.

The above layers are removed by irradiating a laser beam onto the layers in the auxiliary contact hole. However, since an expensive laser irradiating apparatus is required, the fabricating process is complicated and the production cost is increased.

Figure 1:
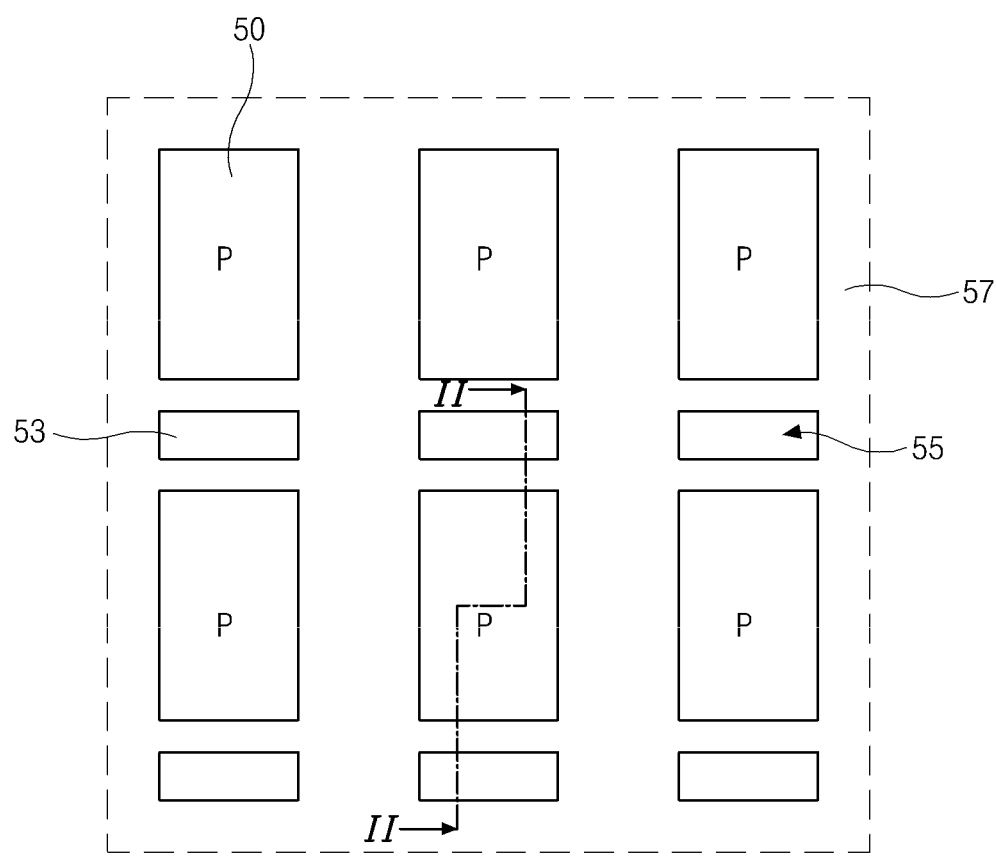
FIG. 1 is a schematic plane view of the related art OLED device.
Figure 2:
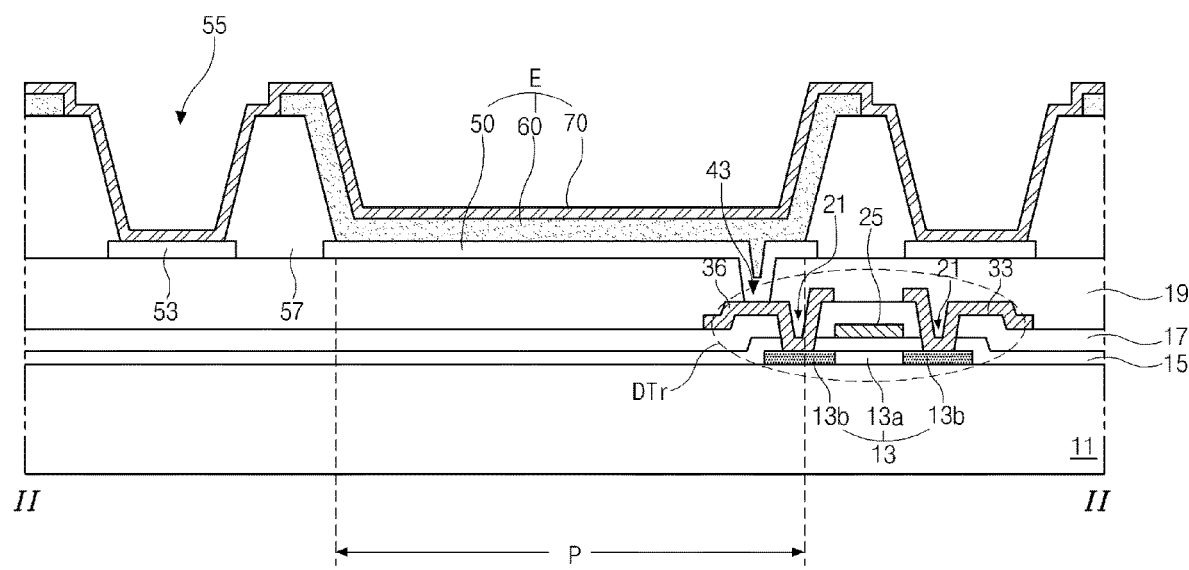
FIG. 2 is a schematic cross-sectional view taken along the line II-II in FIG. 1.
Figure 3:
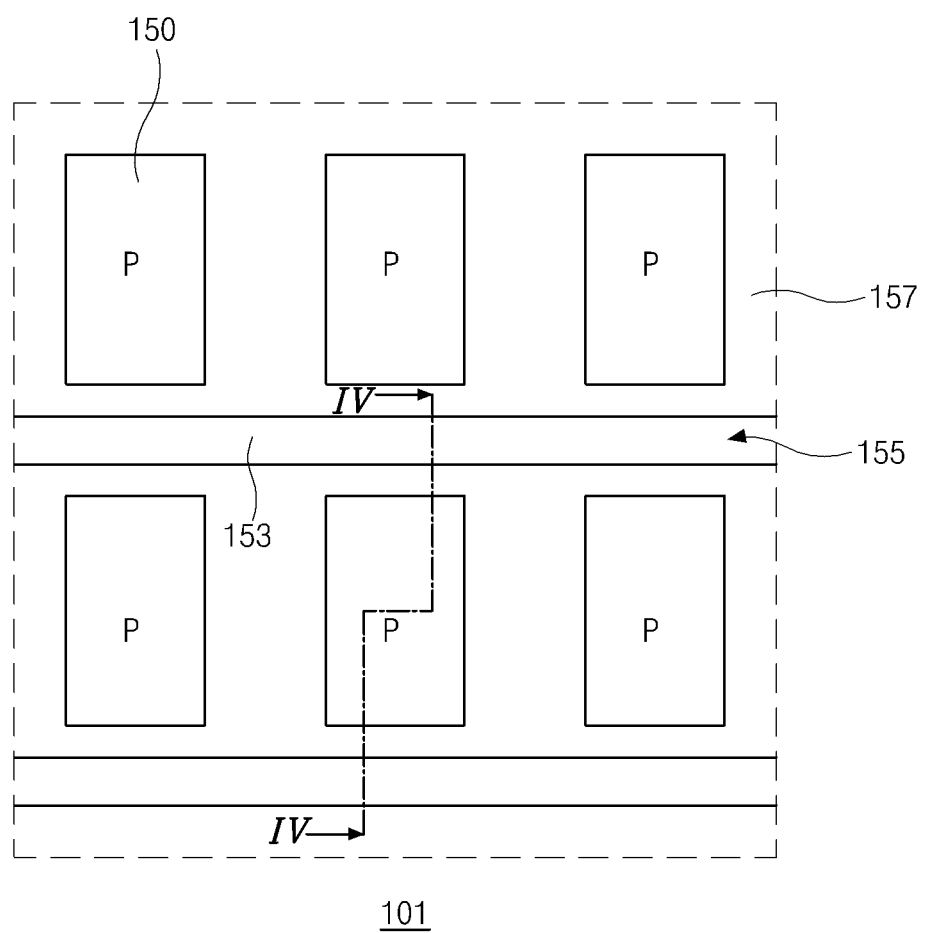
FIG. 3 is a schematic plane view of an OLED device according to an embodiment.
Figure 4:
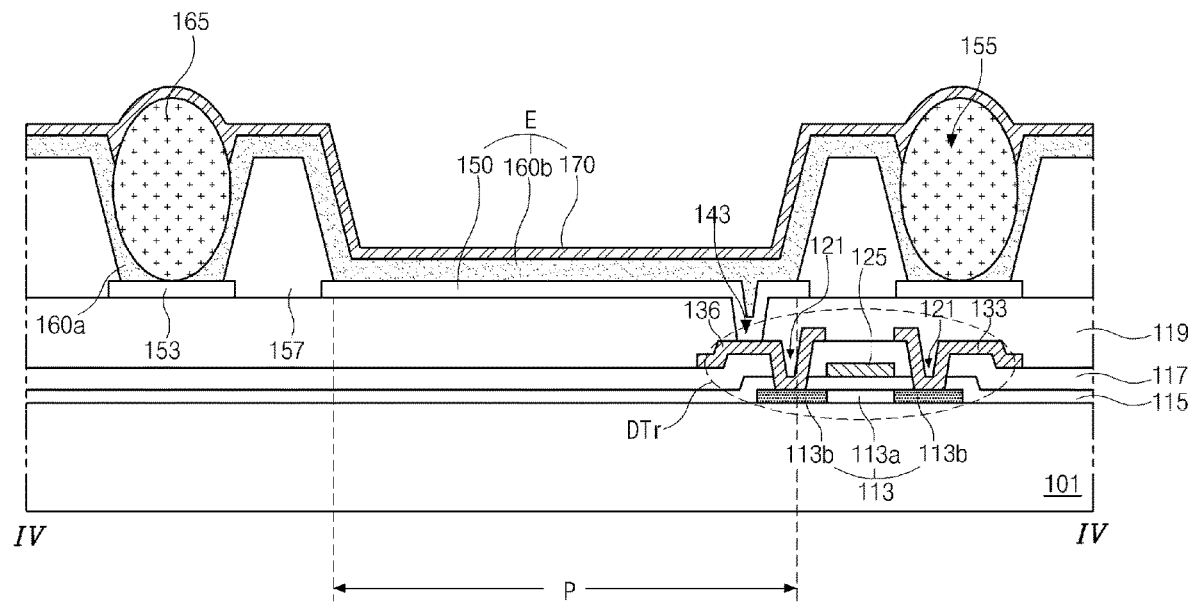
FIG. 4 is a schematic cross-sectional view taken along the line IV-IV in FIG. 3.

FIG. 3 is a schematic plane view of an OLED device according to an embodiment, and FIG. 4 is a schematic cross-sectional view taken along the line IV-IV in FIG. 3.

Referring to FIG. 3, an OLED device according to an embodiment includes a substrate 101, which includes a plurality of pixel regions P, a first electrode 150 disposed on or over the substrate 101 and in each pixel region P, an auxiliary electrode 153 disposed at a boundary of the pixel region P and a bank 157 disposed at the boundary of the pixel region P. The auxiliary electrode 153 is spaced apart from the first electrode 150 and may be disposed in between one or more pairs of pixel regions P, or in between pixel regions P and an edge of the substrate 101. The bank 157 is disposed in between the first electrode 150 and the auxiliary electrode 153, and covers an edge of the auxiliary electrode 153 and an edge of the first electrode 150 adjacent to the edge of the auxiliary electrode 153. The bank 157 includes an auxiliary contact hole 155 exposing a portion of the auxiliary electrode 153.

The auxiliary electrode 153 and the auxiliary contact hole 155 extend along the substrate 101 in a direction between one or more pairs of adjacent pixel regions P.

Referring to FIG. 4, a semiconductor layer 113 including a first region 113a and second regions 113b at both sides of the first region 113a is formed on the substrate 101. The first region 113a is formed of intrinsic poly-silicon, and the second region 113b is formed of impurity-doped poly-silicon.

A gate insulating layer 115 is formed on the semiconductor layer 113, and a gate electrode 125 corresponding to the first region 113a of the semiconductor layer 113 is formed on the gate insulating layer 115. An interlayer insulating layer 117 is formed on the gate electrode 125.

In this instance, semiconductor contact holes 121 are formed through the gate insulating layer 115 and the interlayer insulating layer 117 to expose the second regions 113b of the semiconductor layer 113.

A source electrode 133 and a drain electrode 136, which are spaced apart from each other, are formed on the interlayer insulating layer 117. The source and drain electrodes 133 and 136 are electrically connected to the second regions 113b of the semiconductor layer 113 through the semiconductor contact holes 121, respectively.

The semiconductor layer 113, the gate electrode 125, the source electrode 133 and the drain electrode 136 constitute a driving TFT DTr.

A passivation layer 119, which may provide a flat top surface, is formed on or over the driving TFT DTr and over an entire surface of the substrate 101. A drain contact hole 143 exposing the drain electrode 136 of the driving TFT DTr is formed through the passivation layer 119.

The first electrode 150, which is connected to the drain electrode 136 through the drain contact hole 143, is formed on the passivation layer 119 and in the pixel region P, and the auxiliary electrode 153, which is spaced apart from the first electrode 150, is formed on the passivation layer 119 and at the boundary of the pixel region P in between one or more pairs of adjacent pixel regions P. The first electrode 150 may also be formed in between pixel regions P and an edge of the substrate 101.

The bank 157, which includes the auxiliary contact hole 155 exposing the auxiliary electrode 153, covers an edge of the first electrode 150 and an edge of the auxiliary electrode 153 adjacent to the edge of the first electrode 150, and is formed at the boundary of the pixel region P in between the first electrode 150 and the auxiliary electrode 153. The bank 157 has a lattice shape to surround the pixel region P.

An organic emitting layer 160b is disposed on the first electrode 150. An organic material pattern 160a is disposed on an upper surface of the bank 157 and side surfaces of the bank 157 in the auxiliary contact hole 155, as well as on the portion of the auxiliary electrode 153 exposed through the auxiliary contact hole 155. For example, the organic material pattern 160a may cover side surfaces of the bank 157 in the auxiliary contact hole 155 and may expose at least a portion of the auxiliary electrode 153 in the auxiliary contact hole 155. Alternatively, the organic material pattern 160a may expose an entire surface of the auxiliary electrode 153 in the auxiliary contact hole 155.

The organic material pattern 160a may be in the same layer as one or more layers of the organic emitting layer 160b. For example, the organic material pattern 160a may extend from one or more layers of the organic emitting layer 160b to extend over the bank 157, and cover side surfaces of the bank 157 partially or completely. As another example, the organic material pattern 160a may entirely cover the bank 157 and the auxiliary electrode 153 exposed by the bank 157. Alternatively, the organic material pattern 160a may be spaced apart from the organic emitting layer 160b.

A conductive member 165 contacting the organic material pattern 160a and the exposed portion of the auxiliary electrode 153 is disposed in the auxiliary contact hole 155. In one embodiment, the conductive member 165 is a conductive droplet in which at least a portion of the conductive member 165 has round curvature. For example, the conductive member 165 may be shaped as a conductive ball, a conductive elongated sphere, a conductive ellipsoid, or a hemi-spherical shape.

In addition, a second electrode 170 is disposed over an entire surface of the substrate 101. Namely, the second electrode 170 contacts the organic emitting layer 160b on the first electrode 150 and the conductive member 165 in the auxiliary contact hole 155.

The first and second electrodes 150 and 170 and the organic emitting layer 160b therebetween constitute an organic emitting diode E.

The second electrode 170 is electrically connected to the auxiliary electrode 153 via the conductive member 165. As a result, the resistance or sheet resistance of the second electrode 170 is reduced due to the auxiliary electrode 153 such that the brightness non-uniformity problem can be prevented or minimized.

The organic emitting layer 160b on the first electrode 150 may include a hole injection layer (HIL), a hole transport layer (HTL), an emission layer (EML), an electron transport layer (ETL), and an electron injection layer (EIL) sequentially stacked on the first electrode 150. Some of the layers of the organic emitting layer 160b may be formed by a solution process, and the rest of the layers of the organic material layer 160b may be formed by a deposition process. The organic material pattern 160a may be in the same layer as one or more layers of the organic emitting layer 160b formed through a deposition process.

As mentioned above, because of the stability of the material and the emitting property in the layer formed by the solution process, each of the HIL, the HTL, the red emitting material pattern and the green emitting material pattern may be formed in each pixel region P by the solution process, while each of the blue emitting material pattern, the ETL and the EIL may be formed over an entire surface of the substrate 101 by the deposition process.

In this instance, the organic material pattern 160a in the auxiliary contact hole 155 and on the auxiliary electrode 153 includes material patterns formed by the deposition process. For example, the organic material pattern 160a may include an electron transport material pattern and an electron injection material pattern. Alternatively, the organic material pattern 160a may include a blue emitting material pattern, an electron transport material pattern and an electron injection material pattern.

On the other hand, when all layers of the organic emitting layer 160b are formed by the deposition process, the organic material pattern 160a may include similar structure as the organic emitting layer 160b, e.g., a hole injection material pattern, a hole transport material pattern, an electron transport material pattern, and an electron injection material pattern.

Since the material layers, which are deposited, are formed on the auxiliary electrode 153 as well as the first electrode 150, the material layers on the auxiliary electrode 153 should be removed for an electrical connection between the second electrode 170 and the auxiliary electrode 153.

In one embodiment, at least a portion of the organic material pattern 160a on the auxiliary electrode 153 is removed to expose at least a portion of the auxiliary electrode 153, and the conductive member 165 is formed on the exposed portion of the auxiliary electrode 153. In other words, at least a portion of the auxiliary electrode 153 is exposed through an opening in the organic material pattern 160a in which the conductive member 165 contacts the auxiliary electrode 153. In addition, the second electrode 170 is formed on the conductive member 165 such that the second electrode 170 and the auxiliary electrode 153 are electrically connected to each other via the conductive member 165.

The conductive member 165 may be a conductive droplet, a conductive ball, or a conductive elongated sphere. The conductive member 165 may be formed by dropping and drying a metal paste 163 (of FIG. 5D) on the organic material pattern 160a in the auxiliary contact hole 155. The metal paste 163 may include a conductive particle, e.g., silver (Ag), aluminum (Al), nickel (Ni) or gold (Au), and a binder. The binder may include a resin, a solvent, and other additives.

In this instance, at least a portion of the organic material pattern 160a on the auxiliary electrode 153 is dissolved into the solvent in the metal paste 163 (of FIG. 5D) such that the conductive member 165 contacts the auxiliary electrode 153 in the auxiliary contact hole 155 after the drying step. Accordingly, the organic material pattern 160a is formed on side surfaces of the bank 157 in the auxiliary contact hole 155 and at least a portion of the auxiliary electrode 153 is exposed such that the conductive member 165 contacts the auxiliary electrode 153.

In other words, the organic layer including the organic material pattern 160a and the organic emitting layer 160b may cover an entire surface of the substrate 101 except a portion in which the conductive member 165 contacts the auxiliary electrode 153. Namely, the conductive member 165 may create an opening in the organic layer in which the conductive member 165 can contact the auxiliary electrode 153.

Figure 6:
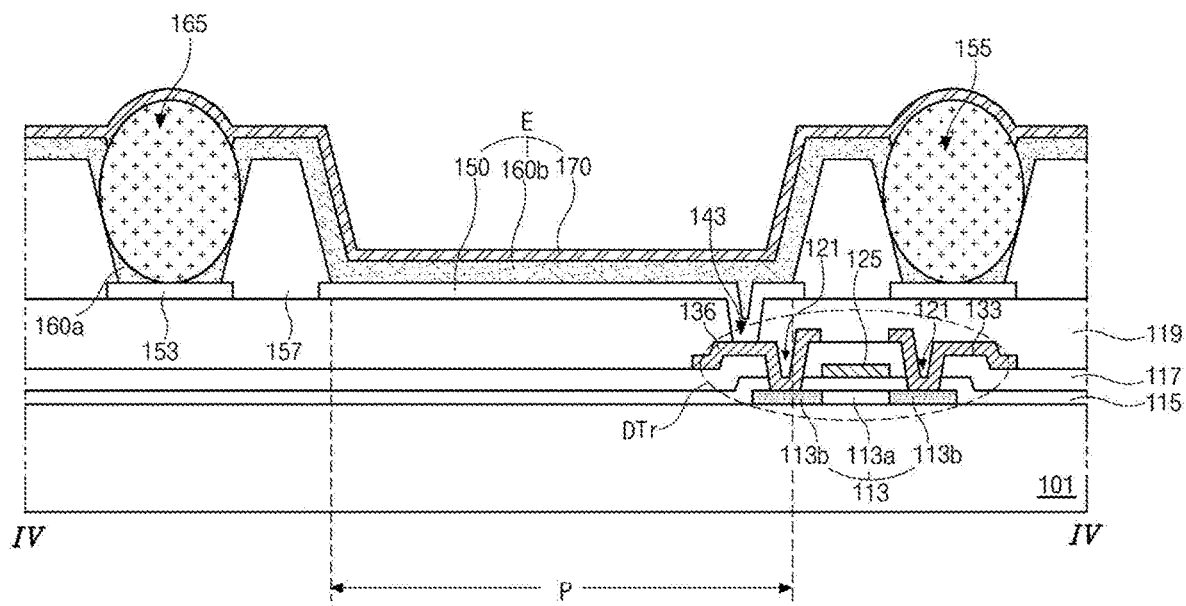
FIG. 6 is a schematic cross-sectional view taken along the line IV-IV in FIG. 3, according to another embodiment.

Alternatively, the organic material pattern 160a on the auxiliary electrode 153 and a portion of the organic material pattern 160a on the side surfaces of the bank 157 may be removed such that the organic material pattern 160a partially covers side surfaces of the bank 157. Alternatively, the organic material pattern 160a on the auxiliary electrode 153 and the side surface of the bank 157 in the auxiliary contact hole 155 may be completely removed such that the conductive member 165 may contact the side surface of the bank 157 as well as the auxiliary electrode 153 as shown in FIG. 6.

On the other hand, the materials on the auxiliary electrode 153 may be partially dissolved by the solvent in the metal paste. In this instance, the organic material pattern 160a may cover the auxiliary electrode 153, and only a center portion of the auxiliary electrode 153 may be exposed. Alternatively, the organic material pattern 160a may cover an entire surface of the auxiliary electrode 153 in the auxiliary contact hole 155 with smaller thickness. Namely, a portion of the organic material pattern 160a on the auxiliary electrode 153 may be thinner than a portion of the organic material pattern 160a on the side surface and/or the upper surface of the bank 157. In this instance, the organic material pattern 160a may have a "U" shape in a cross-sectional view at the auxiliary contact hole 155.

The organic material pattern 160a may extend from one or more layers of the organic emitting layer 160b to extend over the bank 157 and cover an entire surface of the auxiliary electrode 153 exposed by the bank 157. Due to the metal paste, the portion of the organic material pattern 160a contacting the auxiliary electrode 153 may have a smaller thickness than portions of the organic material pattern 160a contacting the bank 157.

Even when the auxiliary electrode 153 partially contacts the conductive member 165 or indirectly contacts the conductive member 165 with the thinner part of the organic material pattern 160a, the electrical connection between the second electrode 170 and the auxiliary electrode 153 via the conductive member 165 can be secured.

Namely, an end of the conductive member 165 is electrically connected to the auxiliary electrode 153 and the other end of the conductive member 165 is electrically connected to the second electrode 170 such that the second electrode 170 is electrically connected to the auxiliary electrode 153.

In the OLED device of the present disclosure, since the organic materials on the auxiliary electrode 153 in the auxiliary contact hole 155 are removed without the expensive laser irradiating apparatus, the fabricating process is simplified and the production cost is reduced. In addition, since the second electrode 170 is electrically connected to the auxiliary electrode 153 via the conductive member 165, the sheet resistance of the second electrode 170 is decreased. Moreover, since the step difference of the second electrode 170 in the auxiliary contact hole 155 is decreased due to the conductive member 165, the disconnection problem of the second electrode 170 in the step of the auxiliary contact hole is prevented. The conductive member 165 may fill the auxiliary contact hole 155 to provide a flat top surface with an upper surface of the organic material pattern 160a on the top surface of the bank 157. In this instance, the second electrode 170 may have a flat top surface over the bank 157 and the auxiliary electrode 153.

The auxiliary electrode 153 and the auxiliary contact hole 155 extend along a direction one or more pairs of adjacent pixel regions P. As a result, the auxiliary contact hole 155 may be referred to as a groove.

In FIG. 3, the auxiliary electrode 153 and the auxiliary contact hole 155 horizontally extend along the substrate 101 in between one or more pairs of pixel regions P. Alternatively, the auxiliary electrode 153 and the auxiliary contact hole 155 may extend in a vertical direction along the substrate 101. Alternatively, the auxiliary electrode 153 and the auxiliary contact hole 155 may extend in a horizontal direction and a vertical direction such that the auxiliary electrode 153 and the auxiliary contact hole 155 have a lattice shape.

Since the auxiliary electrode 153 and the auxiliary contact hole 155 extend along at least one of the horizontal and vertical directions, an area for dropping the metal paste is increased. Accordingly, a size margin of the conductive particle of the conductive member 165 and an aligning margin of the dropping process of the metal paste are increased such that the electrical connection between the second electrode 170 and the auxiliary electrode 153 is secured.

FIGS. 5A to 5F are schematic cross-sectional views illustrating a fabricating process of an OLED device according to an embodiment.

A method of fabricating the OLED device according to the present disclosure includes forming a first electrode 150 and an auxiliary electrode 153, forming a bank 157, forming an organic material pattern 160a and an organic emitting layer 160b, removing a portion of the organic material pattern 160a and forming a conductive member 165, and forming a second electrode 170.

Figure 5A:
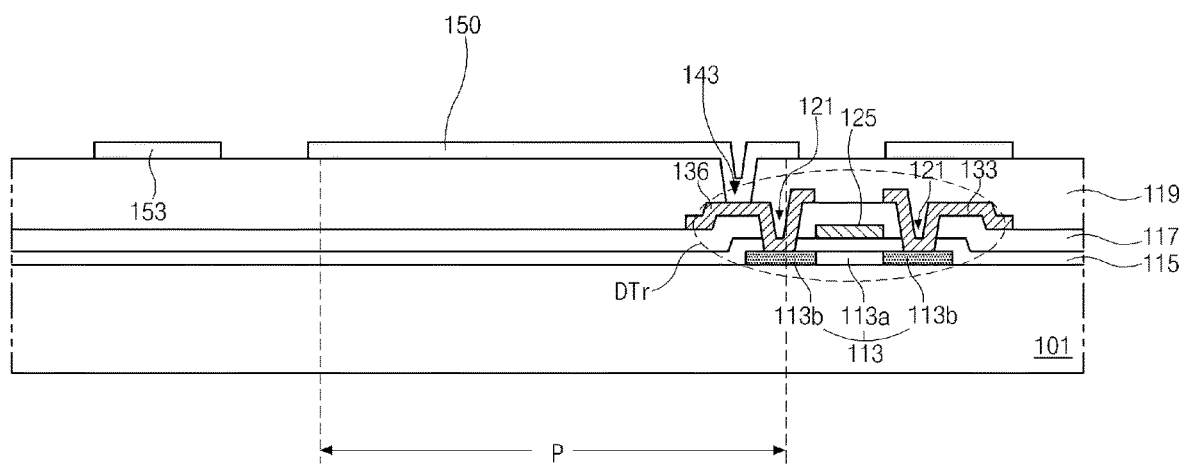
FIGS. 5A to 5F are schematic cross-sectional views illustrating a fabricating process of an OLED device according to an embodiment.

As shown in FIG. 5A, the first electrode 150 and the auxiliary electrode 153 are formed over the substrate 101, where elements, e.g., the driving TFT DTr, the passivation layer 119, and so on are formed. The first electrode 150 is disposed in the pixel region P and is electrically connected to the drain electrode 136 of the driving TFT DTr through the drain contact hole 143. The auxiliary electrode 153 is disposed between a pair of pixel regions P and is spaced apart from the first electrode 150. Each of the first electrode 150 and the auxiliary electrode 153 may be formed of the same material. For example, each of the first electrode 150 and the auxiliary electrode 153 may be formed of a transparent conductive material, e.g., indium-tin-oxide (ITO) and indium-zinc-oxide (IZO).

Figure 5B:
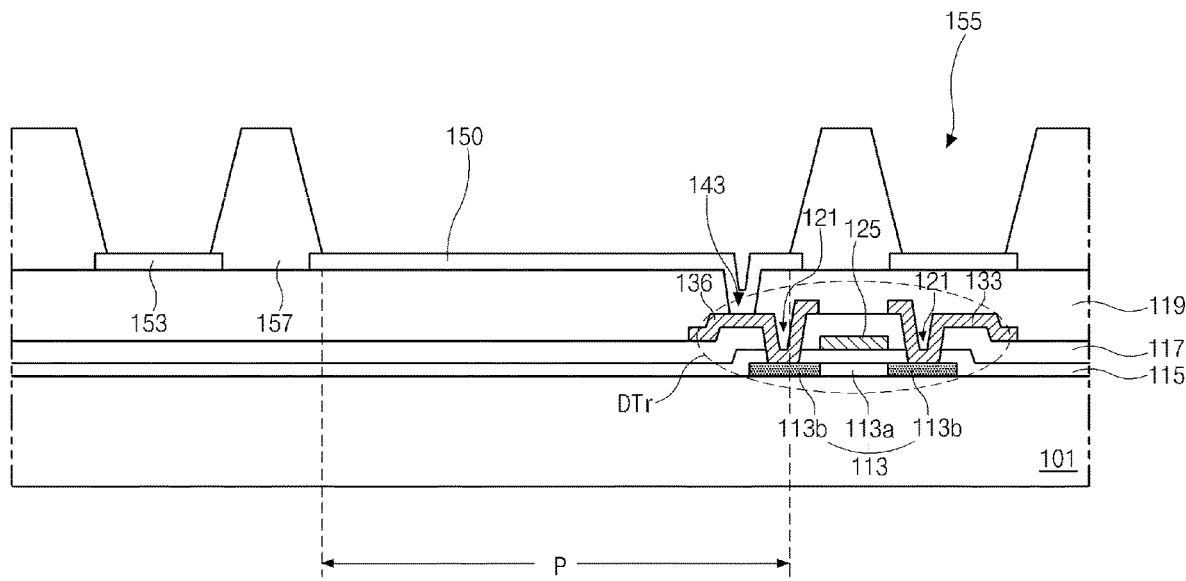

Next, as shown in FIG. 5B, an insulating material layer (not shown) is formed and patterned to form the bank 157. The bank 157 includes the auxiliary contact hole 155 and an opening. The auxiliary electrode 153 is exposed through the auxiliary contact hole 155, and the first electrode 150 is exposed through the opening. Namely, the bank 157 covers edges of the auxiliary electrode 153 and the first electrode 150.

Figure 5C:
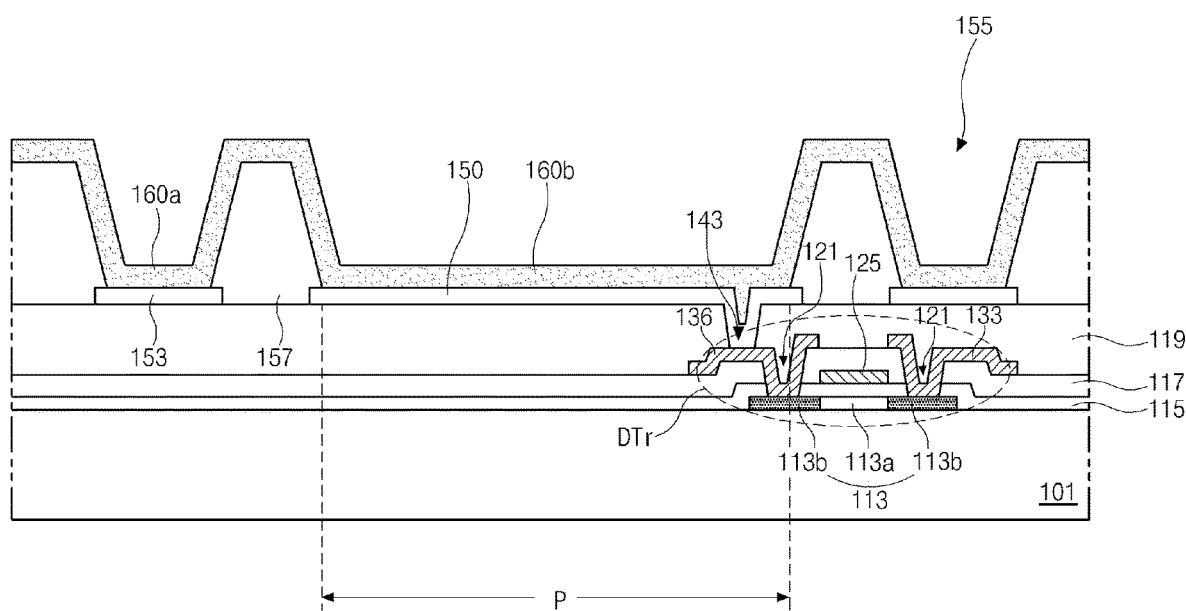

Next, as shown in FIG. 5C, the organic material pattern 160a and the organic emitting layer 160b are formed over the substrate 101 including the bank 157. The organic material pattern 160a is formed on the auxiliary electrode 153 in the auxiliary contact hole 155 and the upper and side surfaces of the bank 153. The organic emitting layer 160b is formed on the first electrode 150. The organic material pattern 160a may be in the same layer as one or more layers of the organic emitting layer 160b, and extend from the one or more layers of the organic emitting layer 160b.

As mentioned above, the organic emitting layer 160b may include the HIL, the HTL, the EML, the ETL and the EIL sequentially stacked on the first electrode 150. Some of the layers of the organic emitting layer 160b may be formed of the deposition process, or all of the layers of the organic emitting layer 160a may be formed of the deposition process.

Because of the stability of the material and the emitting property in the layer formed by the solution process, each of the HIL, the HTL, the red emitting material pattern and the green emitting material pattern may be formed in each pixel region P by the solution process, while each of the blue emitting material pattern, the ETL and the EIL may be formed over an entire surface of the substrate 101 by the deposition process. This process may be referred to as a solution fabricating process.

In the solution fabricating process, the layers by the deposition process are formed between the pixel regions P as well as within the pixel region P. Namely, the organic material pattern 160a may have a double-layered structure of an electron transport material pattern and an electron injection material pattern or a triple-layered structure of a blue emitting material pattern, the electron transport material pattern and the electron injection material pattern. Alternatively, in the deposition fabricating process, the organic material pattern 160a may have a structure of a hole injection material pattern, a hole transport material pattern, the electron transport material pattern and the electron injection material pattern.

Figure 5D:
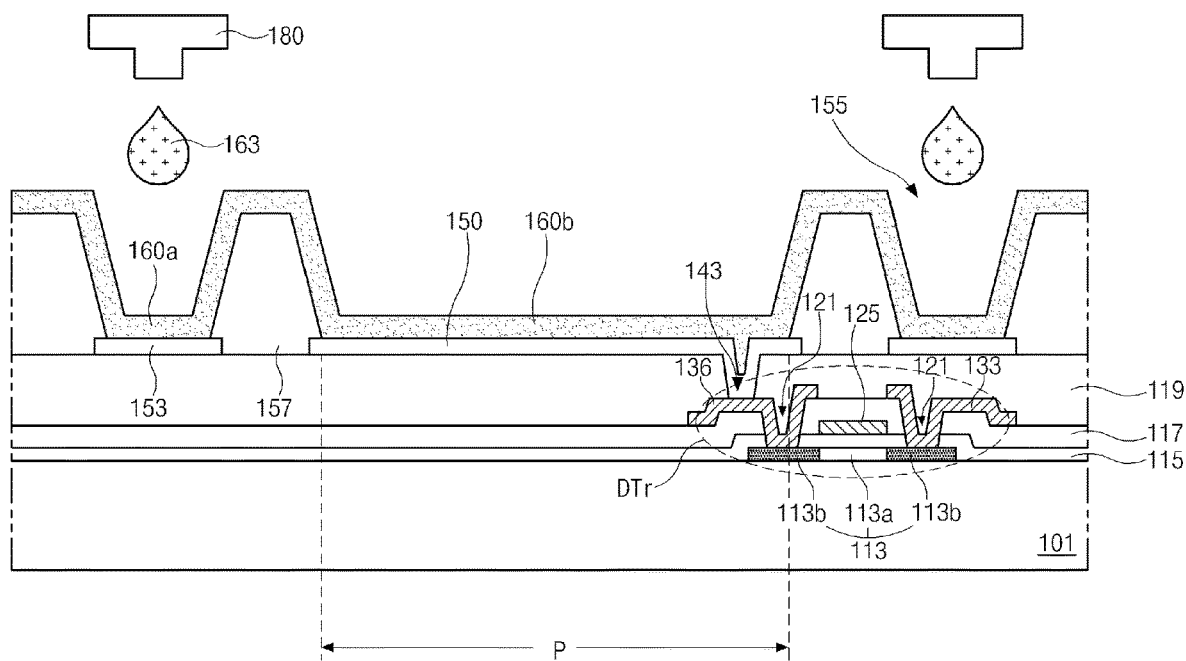

Next, as shown in FIG. 5D, a metal paste 163 is dropped into the auxiliary contact hole 155 using a dispenser 180 such that at least a portion of the organic material pattern 160a on the auxiliary electrode 153 is dissolved. In this instance, the organic material pattern 160a on the auxiliary electrode 153 may be completely or partially dissolved. In addition, the organic material pattern 160a on the side surface of the bank 157 in the auxiliary contact hole 155 may be partially or completely dissolved.

Figure 5E:
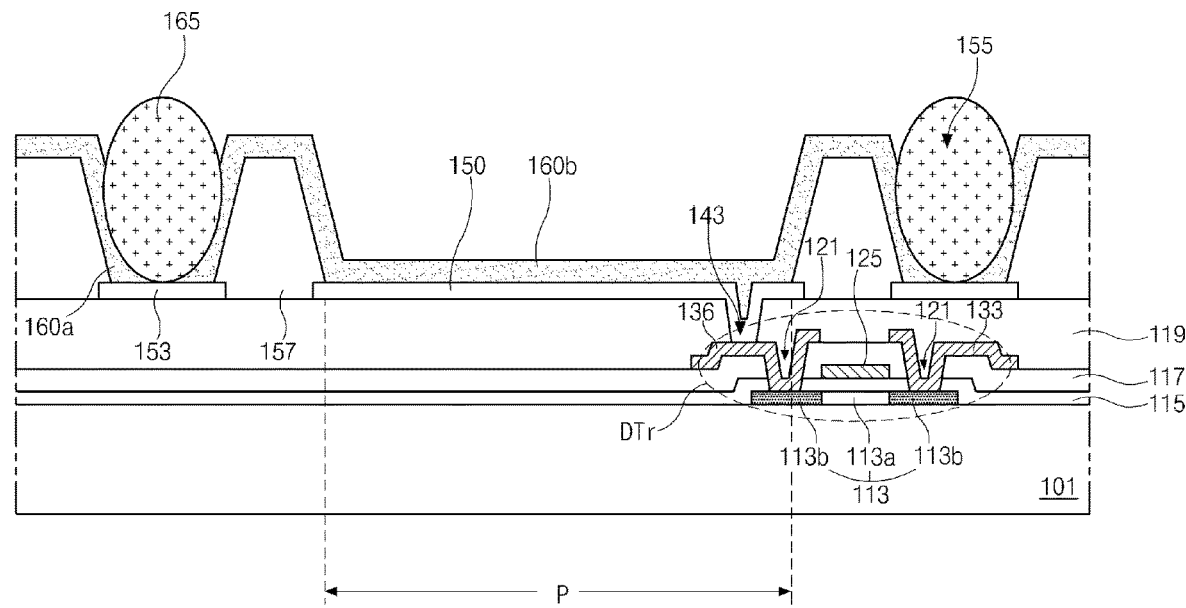

The metal paste 163 and the dissolved organic material of the organic material pattern 160a are dried such that the remaining conductive member 165 is formed in the auxiliary contact hole 155 as shown in FIG. 5E. In one embodiment, the conductive member 165 is a conductive droplet in which at least a portion of the conductive member 165 has round curvature. For example, the conductive member 165 may be shaped as a conductive ball, a conductive elongated sphere, a conductive ellipsoid, or a hemispherical shape.

In FIG. 5E, an end of the conductive member 165 contacts a center of the auxiliary electrode 153. Alternatively, the conductive member 165 may contact an entire upper surface of the auxiliary electrode 153 in the auxiliary contact hole 155. In addition, the conductive member 165 may indirectly contact the auxiliary electrode 153 with a thin organic material pattern 160a therebetween. Moreover, the conductive member 165 may contact the side surface of the bank 157 in the auxiliary contact hole 155.

The conductive member 165 may be a conductive droplet, a conductive ball, or a conductive elongated sphere. The conductive member 165 may be formed by dropping and drying a metal paste 163, which includes a conductive particle, e.g., silver (Ag), aluminum (Al), nickel (Ni) or gold (Au), and a binder, on the organic material pattern 160a in the auxiliary contact hole 155. The binder may include a resin, a solvent and additives.

The materials on the auxiliary electrode 153 are dissolved into the solvent in the metal paste 163 and the materials and the solvent are removed by the drying step such that the conductive member 165 contacts the auxiliary electrode 153 in the auxiliary contact hole 155 after the drying step. Accordingly, the organic material pattern 160a is formed on side surfaces of the bank 157 in the auxiliary contact hole 155 and at least a portion of the auxiliary electrode 153 is exposed in which the conductive member 165 contacts the auxiliary electrode 153.

The organic material pattern 160a may also extend from one or more layers of the organic emitting layer 160b along the bank 157 to at least partially cover a side surface of the bank 157 contacting the auxiliary electrode 153. The organic material pattern 160a may also entirely cover the bank 157 and the auxiliary electrode 153 exposed by the bank 157, such that a thickness of a portion of the organic material pattern 160a contacting the auxiliary electrode 153 is smaller than a thickness of a portion of the organic material pattern 160a contacting the bank 157. The organic material pattern 160a may also cover the auxiliary electrode 153, such that at least a portion of the auxiliary electrode 153 is exposed through an opening in the organic material pattern 160a in which the conductive member 165 contacts the auxiliary electrode 153.

Figure 5F:
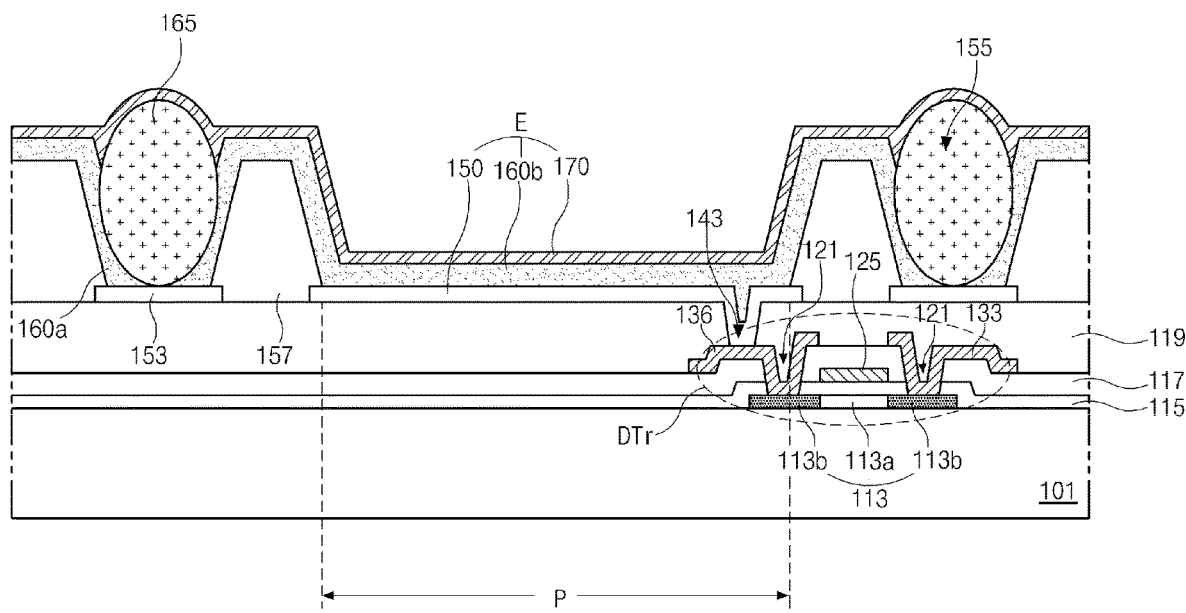

Next, as shown in FIG. 5F, the second electrode 170 is formed on the organic emitting layer 160b, the conductive member 165 and the organic material pattern 160a on an upper surface of the bank 157. The second electrode 170 is formed over an entire surface of the substrate 101, and the first and second electrodes 150 and 170 and the organic emitting layer 160b constitutes the organic emitting diode E.

The second electrode 170 contacts the conductive member 165 such that the second electrode 170 and the auxiliary electrode 153 are electrically connected to each other via the conductive member 165.

In the OLED device of the present disclosure, since the organic materials on the auxiliary electrode 153 in the auxiliary contact hole 155 are removed without the expensive laser irradiating apparatus, the fabricating process is simplified and the production cost is reduced. In addition, since the second electrode 170 is electrically connected to the auxiliary electrode 153 via the conductive member 165, the sheet resistance of the second electrode 170 is decreased. Moreover, since the step difference of the second electrode 170 in the auxiliary contact hole 155 is decreased due to the conductive member 165, the disconnection problem of the second electrode 170 in the step of the auxiliary contact hole is prevented.

It will be apparent to those skilled in the art that various modifications and variations can be made to the embodiments without departing from the scope of the appended claims. Thus, it is intended that the embodiments are not limiting and modifications and variations are covered provided they come within the scope of the appended claims and their equivalents.

What is claimed is:

1. An organic light emitting display device, comprising:
a substrate including a plurality of pixel regions;
a first electrode over the substrate and in a pixel region of the plurality of pixel regions;
an auxiliary electrode over the substrate, the auxiliary electrode spaced apart from the first electrode and disposed in between the pixel region and another pixel region of the plurality of pixel regions;
a bank over the auxiliary electrode having an auxiliary contact hole, wherein the auxiliary contact hole exposes the auxiliary electrode;
a second electrode over the first electrode and the auxiliary electrode;
an organic layer disposed between the first electrode and the second electrode, and disposed between the second electrode and the auxiliary electrode; and
a conductive droplet between the auxiliary electrode and the second electrode and electrically connecting the second electrode to the auxiliary electrode,
wherein the conductive droplet directly contacts a first portion of a side surface of the bank in the auxiliary contact hole, and
wherein at least a part of the organic layer directly contacts a second portion of the side surface of the bank in the auxiliary contact hole.

2. The organic light emitting display device of claim 1, wherein the organic layer includes a blue light emitting layer.

3. The organic light emitting display device of claim 1, wherein the organic layer further includes at least one of a red light emitting layer and a green light emitting layer between the first electrode and the second electrode.

4. The organic light emitting display device of claim 1, wherein the auxiliary electrode extends along the substrate in between one or more pairs of pixel regions including the pixel region and the other pixel region.

5. The organic light emitting display device of claim 1, wherein the bank covers an edge of the first electrode and an edge of the auxiliary electrode adjacent to the edge of the first electrode, wherein the auxiliary electrode is exposed through the auxiliary contact hole in the bank.

6. The organic light emitting display device of claim 5, wherein the organic layer is disposed on the auxiliary electrode, and wherein the conductive droplet is disposed in the auxiliary contact hole and contacts the auxiliary electrode through an opening in the organic layer.

7. The organic light emitting display device of claim 5, wherein the conductive droplet contacts the auxiliary electrode.

8. The organic light emitting display device of claim 5, wherein the organic layer is further disposed over the bank, and the organic layer includes an organic emitting portion disposed over the first electrode, and an organic material pattern portion disposed over the bank and the auxiliary electrode, wherein the organic material pattern portion is in the same layer as one or more layers of the organic emitting portion.

9. The organic light emitting display device of claim 8, wherein the organic material pattern portion contacts edges of the auxiliary electrode, and the conductive droplet contacts a center of the auxiliary electrode.

10. The organic light emitting display device of claim 8, wherein the organic material pattern portion is between the conductive droplet and the auxiliary electrode.

11. An organic light emitting display device, comprising:
a substrate having a plurality of first electrodes, the plurality of first electrodes comprising:
a first row of two or more first electrodes arranged along a first direction on the substrate, and
a second row of two or more first electrodes arranged along the first direction on the substrate;
an auxiliary electrode disposed in between the first row of first electrodes and the second row of first electrodes, where the auxiliary electrode is spaced apart from the first row of first electrodes and the second row of first electrodes, wherein at least a part of the auxiliary electrode extends along the first direction to overlap with two or more first electrodes of the first row of first electrodes and two or more first electrodes of the second row of first electrodes in a second direction different from the first direction;
a bank over the auxiliary electrode having an auxiliary contact hole, wherein the auxiliary contact hole extends along the first direction between the first row of first electrodes and the second row of first electrodes to expose the part of the auxiliary electrode, and to overlap with the two or more first electrodes of the first row of first electrodes and the two or more first electrodes of the second row of first electrodes in the second direction;
an organic emitting layer disposed on at least one of the first electrodes;
a conductive member disposed on the auxiliary electrode, wherein the conductive member directly contacts a first portion of a side surface of the bank in the auxiliary contact hole, and wherein at least a part of the organic emitting layer directly contacts a second portion of the side surface of the bank in the auxiliary contact hole; and
a second electrode disposed on the organic emitting layer and the conductive member, the second electrode electrically connected to the auxiliary electrode through the conductive member, wherein
in the first direction, a length of each of the auxiliary electrode and the auxiliary contact hole is greater than a length summation of the two or more first electrodes of the first row.

12. The organic light emitting display device of claim 11, wherein the bank is disposed between the first electrode and the auxiliary electrode and covers edges of the auxiliary electrode and the first one of the first electrodes adjacent to the auxiliary electrode.

13. The organic light emitting display device of claim 12, further comprising an organic material pattern that extends from one or more layers of the organic emitting layer along the bank to at least partially cover the side surface of the bank contacting the auxiliary electrode.

14. The organic light emitting display device of claim 13, wherein the organic material pattern covers the bank and the auxiliary electrode exposed by the bank, a thickness of a portion of the organic material pattern contacting the auxiliary electrode being smaller than a thickness of a portion of the organic material pattern contacting the bank.

15. The organic light emitting display device of claim 11, further comprising an organic material pattern covering the auxiliary electrode, wherein at least a portion of the auxiliary electrode is exposed through an opening in the organic material pattern in which the conductive member contacts the auxiliary electrode.

16. The organic light emitting display device of claim 1, wherein the conductive droplet has one of a droplet shape, a spherical shape, or an elongated sphere shape.

17. The organic light emitting display device of claim 11, wherein the conductive member has one of a droplet shape, a spherical shape, or an elongated sphere shape.

18. The organic light emitting display device of claim 11, wherein the auxiliary contact hole continuously extends along the first direction to overlap with the two or more first electrodes of the first row of first electrodes and the two or more first electrodes of the second row of first electrodes in the second direction.

* * * * *